(12) United States Patent
Piper (10) Patent No.: US 10,309,851 B2
(45) Date of Patent: Jun. 4, 2019

(54) RAPID PRESSURE RISE DETECTION AND MANAGEMENT SYSTEM (71) Applicant: Qualitrol Company LLC, Fairport, NY (US)

(72) Inventor: John R. Piper, Clifton Springs, NY (US)

(73) Assignee: Qualitrol Company LLC, Fairport, NY (US)

( * ) Notice: Subject to any disclaimer, the term of this patent is extended or adjusted under 35 U.S.C. 154(b) by 149 days.

(21) Appl. No.: 15/634,285

(22) Filed: Jun. 27, 2017

(65) Prior Publication Data

US 2017/0370794 A1 Dec. 28, 2017

Related U.S. Application Data (60) Provisional application No. 62/355,759, filed on Jun. 28, 2016.

(51) Int. Cl.
| | |
|---|---|
| *H01F 27/00* | (2006.01) |
| *H02H 5/08* | (2006.01) |
| *H02H 7/04* | (2006.01) |
| *G01L 11/04* | (2006.01) |
| *G01R 31/02* | (2006.01) |
| *H01F 27/40* | (2006.01) |

(52) U.S. Cl.
CPC ............ *G01L 11/04* (2013.01); *G01R 31/027* (2013.01); *H01F 27/402* (2013.01); *H02H 5/08* (2013.01); *H02H 7/04* (2013.01)

(58) Field of Classification Search
CPC ....... G01L 11/04; G01R 31/027; H01F 27/00; H01F 27/40; H01F 27/402; H02H 7/04
See application file for complete search history.

(56) References Cited

U.S. PATENT DOCUMENTS

| | | | |
|---|---|---|---|
| 4,001,644 A * | 1/1977 | Lingenfelter | ......... H01F 27/402 361/37 |
| 4,074,096 A | 2/1978 | Romanowski | |
| 4,218,716 A * | 8/1980 | Narbus | .................... H02H 5/08 361/110 |
| 4,823,224 A | 4/1989 | Hagerman et al. | |

(Continued)

FOREIGN PATENT DOCUMENTS

| | | |
|---|---|---|
| DE | 198 19 472 A1 | 6/1999 |
| JP | 2-133033 A | 5/1990 |
| KR | 10-2009-0042605 A | 4/2009 |

*Primary Examiner* — Nguyen Q. Ha (74) *Attorney, Agent, or Firm* — Seed Intellectual Property Law Group LLP (57) ABSTRACT

A rapid pressure rise detection and management system that detects internal pressure changes in a transformer. The rapid pressure rise detection and management system communicates with one or more pressure sensors attached to a tank of the transformer and measures the rate of pressure change versus time. The rapid pressure rise detection and management system then compares this rate of pressure change against a set of parameters to determine if this pressure change is an internal fault requiring the transformer to be taken offline or external fault to be ignored. This rapid pressure rise detection and management system may be a standalone device or work with other monitoring/controlling equipment to expand its sensing and management capabilities.

34 Claims, 5 Drawing Sheets

(56) References Cited

U.S. PATENT DOCUMENTS 4,903,160 A 2/1990 Elmore et al.
5,949,343 A * 9/1999 Sesekura ............ G01R 31/1281
340/646

* cited by examiner

FIG. 1A — 900 Series Limits

FIG. 1B — 910 Series Limits

RAPID PRESSURE RISE DETECTION AND MANAGEMENT SYSTEM

TECHNICAL FIELD

This application is directed to detecting and managing rapid pressure rises and, in particular, to detecting and managing rapid pressure rises in a transformer.

BACKGROUND

A prime component of any electrical power grid system is the transformer. Transformers are critical to the power grid system and expensive to replace. Therefore, it is a high priority of utility companies and power companies to protect them against internal and external events that may cause damage or failure. One such event is internal arcing, which in an oil-filled transformer, can instantly vaporize the surrounding oil. The oil vaporization can lead to high gas pressures that may rupture the tank.

To prevent or minimize the damage caused by internal arcing, rapid changes in gas pressure must be monitored and detected. When rapid gas pressure changes are detected, the transformer must be taken offline (i.e., the transformer must be turned off). However, external faults to the transformer (e.g., transmission line faults or geomagnetic induced currents) can also cause a pressure rise to occur inside the tank due to an increase in winding heating. It is undesirable to have external faults to the transformer trip the transformer offline.

To differentiate between internal and external faults, a system should be employed that measures variations in time and pressure intensity. The measurement of these variations is significant since a rapid pressure rise system may be installed in the gas space above the cooling oil or in the cooling oil itself. An event that causes a change in pressure has a greater magnitude in the oil space versus the gas space. The gas space mutes the intensity of the pressure change since the gas is more compressible than the oil. Therefore, the response of a rapid pressure rise detection system in the gas space must be faster in order to compensate for this change in transfer intensity. A significant technological challenge to be overcome with a rapid pressure rise detection device is to react to events that will cause further damage and not react to any extraneous stimulus and unnecessarily take the transformer offline. It is problematic to unnecessarily take a transformer offline because a utility company must deploy repair crews anytime a transformer is taken offline.

Figure 1A:
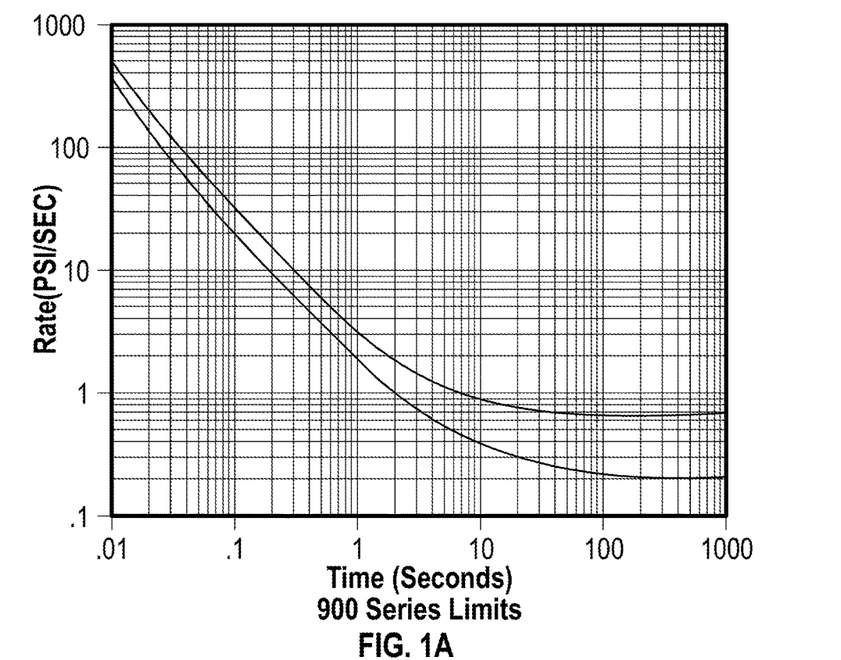
FIGS. 1A and 1B are graph views of mechanical rapid pressure rise curves.
Figure 1B:
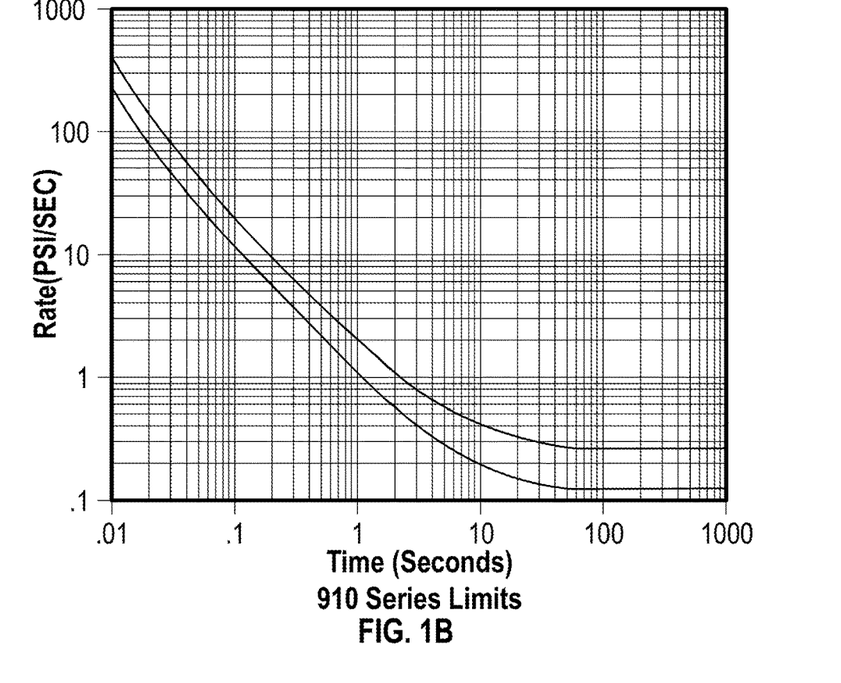

Historically, mechanical rapid pressure rise relays ("RPRRs") have been used (e.g., U.S. Pat. No. 4,074,096) as a protection scheme for oil filled power transformers. These devices may use bellows or other sensitive mechanical elements to sense a rate of pressure change and then actuate switches used for tripping a transformer offline. The response curves for the mechanical RPRRs described by U.S. Pat. No. 4,074,096 are shown in FIG. 1. The key features of these curves are as follows: (1) the relay must not trip a transformer offline for any pressure changes of less than 0.22 psi per second; (2) the time for a relay mounted in the gas space of a transformer to operate for a pressure rate of 10 psi per second is 0.178 seconds; and (3) for a relay mounted in the cooling oil, the time to operate the relay for a pressure rate of 10 psi per second is 0.267 seconds. Significantly, in the mechanical RPRRs, these responses to pressure changes are fixed.

The actual pressure rate of rise due to an external fault in an oil-filled transformer is dependent on many different factors (e.g., transformer design, electrical impedances, transformer location, and the like). Therefore, it is desirable for a rapid pressure rise detection system to have the ability to adjust the sensitivity level or response of the RPRR after the system has been installed.

In this manner, U.S. Pat. No. 4,823,224 incorporates an analog rapid pressure rise circuit for detecting changes in pressure using discrete electronic components and electromechanical relays for tripping a transformer offline. This analog rapid pressure rise circuit allows for the adjustment of the response of the RPRR. Accordingly, this analog rapid pressure rise circuit can have its sensitivity level adjusted after its installation to have the same response as a previously installed relay. The range of response curves described by U.S. Pat. No. 4,823,224 matched both sets of curves previously disclosed by U.S. Pat. No. 4,074,096 as shown in FIG. 1.

The response curves in FIG. 1 from the U.S. Pat. No. 4,074,096, which are further explained in U.S. Pat. No. 4,823,224, follow the equation of:

$$t = -T(\ln[1 - ((dp\ \text{Max})/(dp/dt))])$$

where: 'T' is the time constant of the Time delay circuit;

'dp Max' is the maximum rate of change of pressure which will not cause a relay to operate (in this case 0.22 psi/sec);

'dp/dt' is the rate of pressure change; and

't' is the time of operate.

Using the cardinal points from the curve and solving for 'T' gives 'T'=8 seconds for the RPRR mounted in the gas space and 12 seconds for a relay mounted in the cooling oil. For any RPRR device, regardless of whether it is mechanical or electrical, once it has detected a pressure rate of rise greater than the sensitivity curve setting it should take the transformer offline within one electrical cycle (60 Hz=16 mSec; 50 Hz=20 mSec).

Mechanical RPRRs have been around for many years and are still used extensively on transformers. However, mechanical RPRRs have some significant limitations. First, mechanical RPRRs are not adjustable in the field. Accordingly, the response curves of mechanical RPRRs depend on the tolerance of the mechanical elements and how they are manufactured. Once mechanical RPRRs are built, they have one and only one sensitivity setting. As such, a mechanical RPRR built for the gas space will not work in the cooling oil and a mechanical RPRR built for the cooling oil will not work in the gas space. Additionally, a mechanical device requires an external latching switch to capture a momentary function of the unit.

While electronic analog RPRR devices have some sensitivity adjustment, this adjustment is limited. The electronic boards are built with a limited set of response curves and the adjustment only allows the user to switch from one preset, fixed curve to the next preset, fixed curve. Even with this minor adjustment capability, present electronic analog RPRRs cannot discern between internal pressure faults and some normal transformer operations or external events, such as seismic events. There is a continuing need in the art for a rapid pressure rise detection system that can overcome these limitations.

Notably, all of the subject matter discussed in this section is not necessarily prior art and should not be assumed to be prior art merely as a result of its discussion in this section. Accordingly, any recognition of problems in the prior art discussed in this section or associated with such subject matter should not be treated as prior art unless expressly stated to be prior art. Instead, the discussion of any subject matter in this section should be treated as part of the identification of the technological problem to be overcome, which in and of itself may also be inventive.

BRIEF SUMMARY

Briefly, and in general terms, a rapid pressure rise relay system for detecting a pressure rise within a transformer is disclosed. The system includes one or more pressure sensors associated with the transformer that generate electrical outputs in response to pressure changes within the transformer; a seismic sensor that measures seismic activity and generates an electrical output in response to the seismic activity; a relay that includes one or more electrically controlled actuation contacts to take the transformer offline; one or more processors in communication with the one or more pressure sensors, one or more auxiliary transformer components associated with the transformer, the seismic sensor, the relay, and a control system having a memory device storing a set of instructions therein. The one or more auxiliary transformer components associated with the transformer each generate an electrical output that identifies a status.

The set of instructions stored in the control system, when executed by the one or more processors, cause the one or more processors to examine the electrical outputs generated by the one or more pressure sensors; calculate the pressure rise within the transformer over time using the electrical outputs generated by the one or more pressure sensors; compare the calculated pressure rise within the transformer over time to one or more rapid pressure rise curves; identify the status of the auxiliary transformer components that cause internal pressure readings and compensate for the internal pressure readings from the auxiliary transformer components to prevent unnecessary relay actuation; identify seismic activity using the seismic sensor and prevent unnecessary relay actuation from the seismic activity; and actuate the relay and take the transformer offline if the calculated pressure rise within the transformer over time exceeds allowable limits set by the one or more rapid pressure rise curves.

In an aspect of some embodiments, the auxiliary transformer components associated with the transformer that each generate an electrical output identifying a status include pumps, fans, motors, coolers, breathers, dryers, and tap changers. In another aspect of some embodiments, the seismic sensor that measures seismic activity and generates an electrical output in response to the seismic activity is an accelerometer. In still another aspect of some embodiments, the control system compensates for the auxiliary transformer components that cause internal pressure readings by identifying, isolating, and ignoring the internal pressure readings caused by the auxiliary transformer components. In yet another aspect of some embodiments, the control system compensates for the auxiliary transformer components that cause internal pressure readings by temporarily having the control system halt calculations of the pressure rise within the transformer.

Referring now to another aspect of some embodiments, the control system compensates for the pressure readings caused by the seismic activity identified with the seismic sensor by identifying, isolating, and ignoring the pressure readings caused by the seismic activity. In still another aspect of some embodiments, the control system compensates for the pressure readings caused by the seismic activity identified with the seismic sensor by temporarily having the control system halt calculations of the pressure rise within the transformer. In yet another aspect of some embodiments, the control system is configured to learn new rapid pressure rise curves in response to transformer operating characteristics.

In one aspect of some embodiments, the control system is programmable for rate of rapid pressure rise curve parameters, wherein the control system includes multiple rates of rapid pressure rise curves, and wherein the control system enables automatic shifting between the rapid pressure rise curves according to transformer operating characteristics. In another aspect of some embodiments, the system further comprises multiple pressure sensors to detect pressure changes within the transformer, wherein the control system compares rates of pressure changes detected by the multiple pressure sensors within the transformer to the rapid pressure rise curves and uses voting logic to determine whether to actuate the relay. In still another aspect of some embodiments, the multiple pressure sensors comprise three pressure sensors that are positioned orthogonally to each other within the transformer.

In another embodiment, a rapid pressure rise relay system for detecting a pressure rise within a transformer is disclosed, in which the transformer contains one or more pressure sensors generating electrical outputs in response to pressure changes within the transformer. The system includes one or more processors in communication with the one or more pressure sensors, auxiliary transformer components, a seismic sensor, and a relay, as well as a control system having a memory device storing a set of instructions therein.

The set of instructions stored in the control system, when executed by the one or more processors, cause the one or more processors to examine the electrical outputs generated by the one or more pressure sensors; calculate the pressure rise within the transformer over time using the electrical outputs generated by the one or more pressure sensors; compare the calculated pressure rise within the transformer over time to one or more rapid pressure rise curves; identify a status of the auxiliary transformer components that cause internal pressure readings and compensate for the internal pressure readings from the auxiliary transformer components to prevent unnecessary relay actuation; identify pressure readings caused by seismic activity using the seismic sensor and compensate for the pressure readings caused by the seismic activity to prevent unnecessary relay actuation; and actuate the relay and take the transformer offline if the calculated pressure rise within the transformer over time exceeds allowable limits set by the one or more rapid pressure rise curves.

In still another embodiment, a rapid pressure rise relay system for detecting a pressure rise within a transformer is disclosed, in which the transformer contains one or more pressure sensors generating electrical outputs in response to pressure changes within the transformer. The system includes one or more processors in communication with the one or more pressure sensors, auxiliary transformer components, a seismic sensor, and a relay, as well as a control system having a memory device storing a set of instructions therein.

The set of instructions stored in the control system, when executed by the one or more processors, cause the one or more processors to examine the electrical outputs generated by the one or more pressure sensors; calculate the pressure rise within the transformer over time using the electrical outputs generated by the one or more pressure sensors; compare the calculated pressure rise within the transformer over time to one or more rapid pressure rise curves; identify pressure readings caused by non-internal arcing events and compensate for the pressure readings caused by the non-internal arcing events to prevent unnecessary relay actuation; and actuate the relay and take the transformer offline if the calculated pressure rise within the transformer over time exceeds allowable limits set by the one or more rapid pressure rise curves.

These features, with other technological improvements that will become subsequently apparent, reside in the details of construction and operation as more fully described hereafter and claimed, reference being had to the accompanying drawings forming a part hereof.

BRIEF DESCRIPTION OF THE SEVERAL VIEWS OF THE DRAWINGS

The present application will be more fully understood by reference to the following figures, which are for illustrative purposes only. The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Persons of ordinary skill in the art will understand that the present disclosure is illustrative only and not in any way limiting. Other embodiments and various combinations of the presently disclosed system and method readily suggest themselves to such skilled persons having the assistance of this disclosure.

Each of the features and teachings disclosed herein can be utilized separately or in conjunction with other features and teachings to provide a rapid pressure rise detection and management system. Representative examples utilizing many of these additional features and teachings, both separately and in combination, are described in further detail with reference to attached FIGS. 2-8. This detailed description is intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present rapid pressure rise detection and management system. However, it will be apparent to one skilled in the art that these specific details are not required to practice the teachings of the present rapid pressure rise detection and management system. Also other methods and systems may also be used.

As described herein, a rapid pressure rise detection and management system is implemented to detect rapid rises in internal pressure within an oil-filled transformer that result from internal arcing in an oil-filled transformer. Notably, the rapid pressure rise detection and management system is a processor-based device. In one embodiment, the rapid pressure rise detection and management system uses one or more pressure sensors that are attached to the oil tank of a transformer to measure the rate of pressure change with respect to time. The system compares the measured rise of pressure rate against a set of configured parameters. Notably, the rapid pressure rise detection and management system then determines whether the measured rise of pressure rate is due to an internal fault or external fault. If the system determines that an internal fault (i.e., internal arcing causing the vaporization of oil) has occurred, then the transformer is taken offline. Conversely, if the rapid pressure rise detection and management system determines that an external fault has occurred, the external fault is ignored. In some embodiments, the rapid pressure rise detection and management system may be a standalone device. In other embodiments, the system in part of a larger controller system that includes other monitoring and controlling equipment with expanded overall sensing capabilities.

Figure 2:
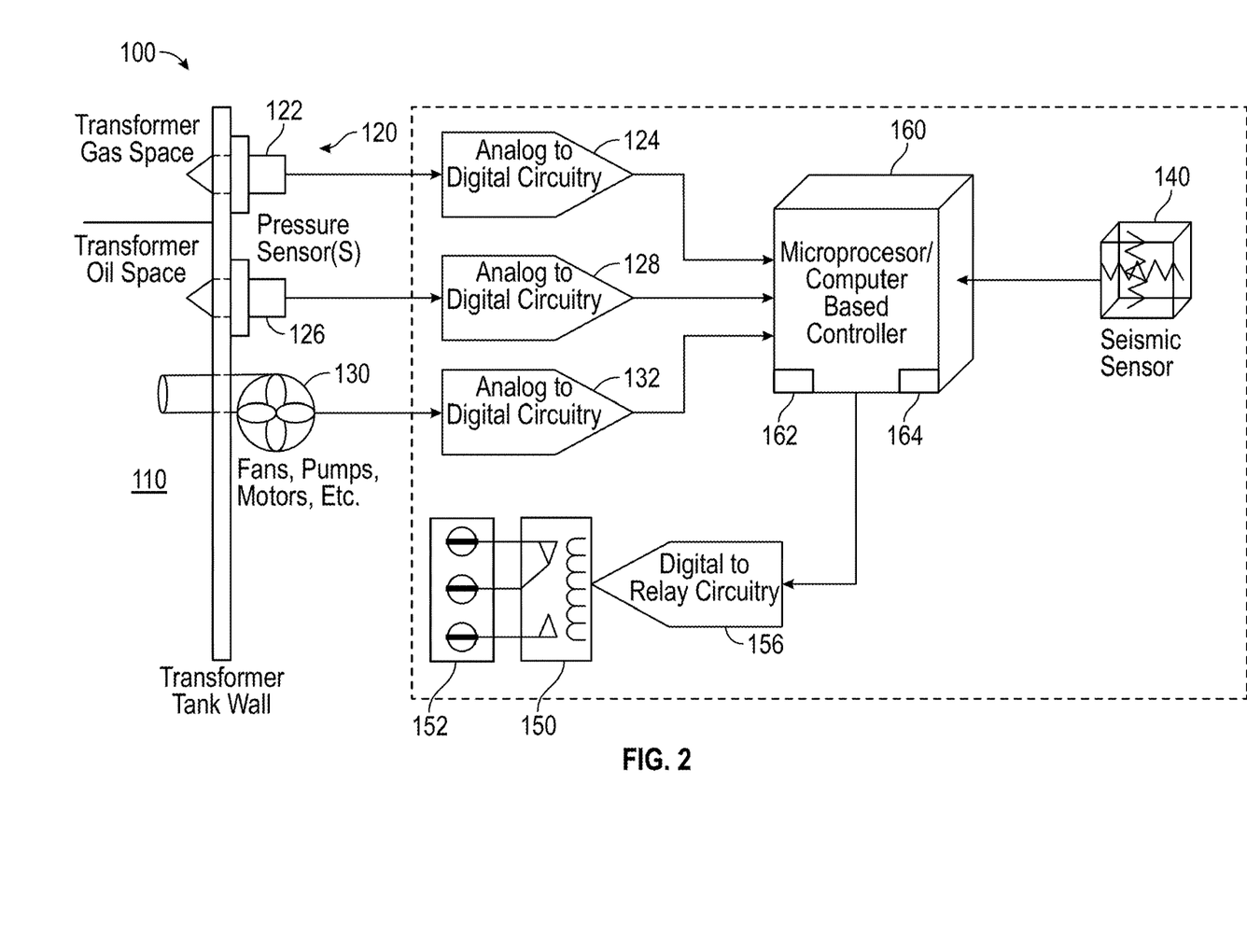
FIG. 2 is a block diagram view of a rapid pressure rise detection and management system.
Figure 3:
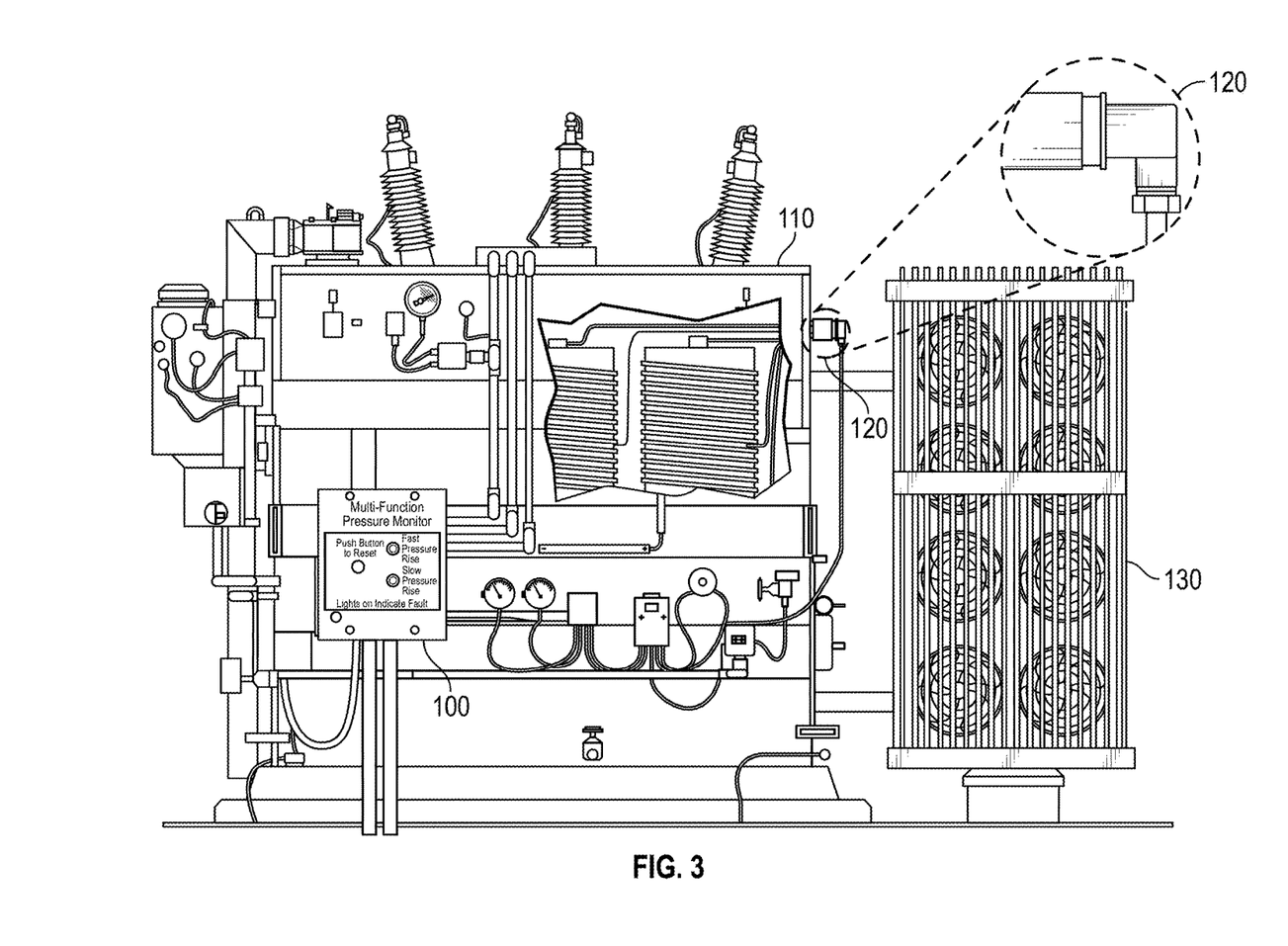
FIG. 3 is a side view of a transformer that is utilizing the rapid pressure rise detection and management system.

Referring now to FIGS. 2 and 3, FIG. 2 is a block diagram that displays one embodiment of a rapid pressure rise detection and management system 100. FIG. 3 shows a side view of a transformer 110 that is utilizing the rapid pressure rise detection and management system 100. The rapid pressure rise detection and management system 100 includes, or is in communication with, one or more pressure sensors 120 (FIG. 3) installed in the transformer 110 that generate electrical outputs in response to pressure changes within the transformer. The rapid pressure rise detection and management system 100 includes, or is in communication with, one or more auxiliary transformer components 130 (FIGS. 2 and 3) that are associated with the transformer 110. One or more auxiliary transformer components 130 each generate an electrical output that identifies the status (e.g., on, off, idle, and the like) of the auxiliary transformer components. In at least one embodiment, the rapid pressure rise detection and management system 100 also includes a seismic sensor 140 (FIG. 2) that measures seismic activity and generates an electrical output in response to the seismic activity. Additionally, the rapid pressure rise detection and management system 100 includes a relay 150 (FIG. 2) having one or more electrically controlled actuation contacts 152 to take the transformer offline. The rapid pressure rise detection and management system 100 also includes a control system 160 (FIG. 2) having an associated memory device 162 storing a set of instructions thereon, as well as one or more processors 164 associated therewith.

As shown in FIG. 2, in one embodiment of the rapid pressure rise detection and management system 100, the transformer 110 has an oil fill line inside of the transformer with a gas space above the oil fill line and an oil space below the oil fill line. As described herein, the term gas space pressure sensor 122 refers to any sensor installed in the gas space of an oil-filled transformer 110 that outputs an electrical signal or mechanical displacement proportional to the gas pressure in the transformer. This includes, but is not limited to, diaphragms, resistor bridges, piezoelectric devices, fiber probes, or other elements that output proportional electric currents or voltages corresponding to gas pressure. As described herein, the term oil space pressure sensor 126 refers to any sensor installed in the oil space of an oil-filled transformer that outputs an electrical signal or mechanical displacement proportional to the gas pressure in the transformer. This includes, but is not limited to, diaphragms, resistor bridges, piezoelectric devices, fiber probes, or other elements that output proportional electric currents or voltages corresponding to the gas pressure.

As shown in FIG. 2, the gas space pressure sensor 122 sends a signal to analog-to-digital circuitry 124 in the rapid pressure rise detection and management system 100. The analog-to-digital circuitry 124 converts the analog signal from the gas space pressure sensor 122 to a digital signal that is forwarded to the control system 160 of the rapid pressure rise detection and management system 100. In another embodiment, the gas space pressure sensor 122 is a digital sensor that sends a digital signal to the control system 160 of the rapid pressure rise detection and management system 100 without requiring the analog-to-digital circuitry 124.

Continuing in FIG. 2, the oil space pressure sensor 126 sends a signal to analog-to-digital circuitry 128 in the rapid pressure rise detection and management system 100. The analog-to-digital circuitry 128 converts the analog signal from the oil space pressure sensor 126 to a digital signal that is forwarded to the control system 160 of the rapid pressure rise detection and management system 100. In another embodiment, the oil space pressure sensor 126 is a digital sensor that sends a digital signal to the control system 160 of the rapid pressure rise detection and management system 100 without requiring the analog-to-digital circuitry 128.

Figure 4:
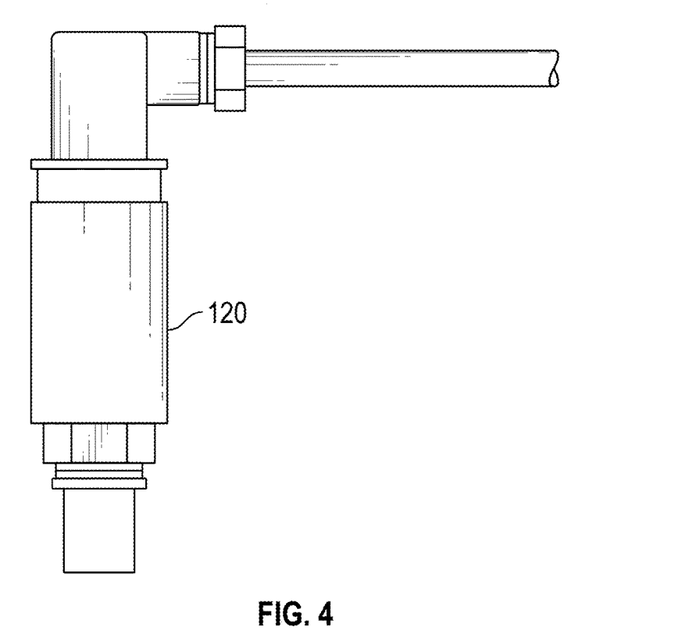
FIG. 4 is a side view of a single sensor pressure monitor that is a component of the rapid pressure rise detection and management system.
Figure 5:
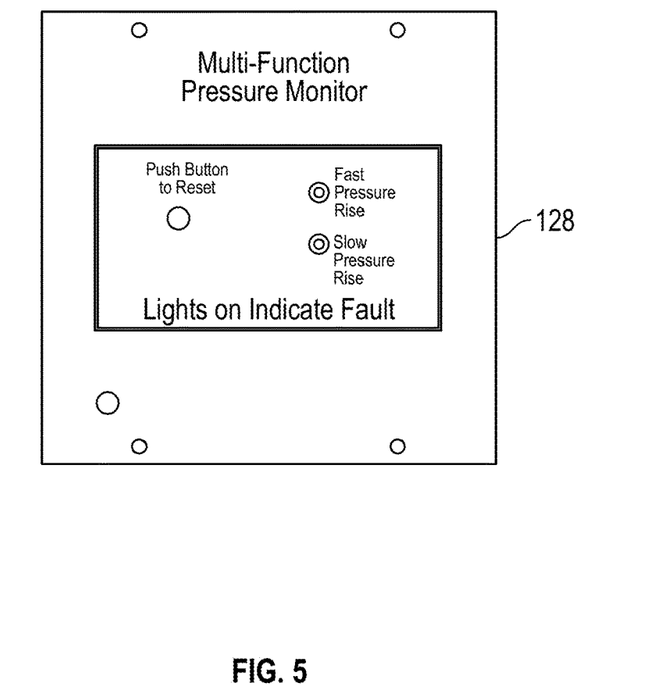
FIG. 5 is a front elevation view of a pressure monitor control box for a single sensor embodiment of the rapid pressure rise detection and management system.

Referring now to FIGS. 4 and 5, FIG. 4 is a side view of a single pressure sensor 120 that is a component of, or is in communication with, the rapid pressure rise detection and management system 100. In one embodiment, the single pressure sensor 120 is a pressure transducer that monitors internal transformer tank pressure and provides identification of sudden pressure internal pressure increases. FIG. 5 is a front elevation view of a pressure monitor control box 128 for a single sensor embodiment of the rapid pressure rise detection and management system 100. In at least one embodiment, the pressure monitor control box 128 includes display lights that indicate faults for fast pressure rise or for slow pressure rise.

Referring now to FIGS. 2 and 3, in some embodiments of the rapid pressure rise detection and management system 100, the oil-filled transformer 110 is associated with auxiliary transformer components 130. These auxiliary transformer components 130 include, but are not limited to, any mechanical or electrical equipment installed on or to a transformer 110 that assists with the functioning of the transformer (e.g., pumps, fans, motors, coolers, breathers, dryers, and tap changers). In at least one embodiment, the auxiliary transformer components 130 each generate an electrical output that identifies the status (e.g., on, off, idle, and the like) of the auxiliary transformer components. As shown in FIG. 2, the auxiliary transformer components 130 send signals to analog-to-digital circuitry 132 in the rapid pressure rise detection and management system 100. The analog-to-digital circuitry 132 converts the analog signal from the auxiliary transformer components 130 to a digital signal that is forwarded to the control system 160 of the rapid pressure rise detection and management system 100. In another embodiment, the auxiliary transformer components 130 are digital components that send digital signals to the control system 160 of the rapid pressure rise detection and management system 100 without requiring the analog-to-digital circuitry 132.

In some embodiments of the rapid pressure rise detection and management system 100, the control system 160 compensates for the auxiliary transformer components 130 that cause internal pressure readings by identifying, isolating, and ignoring the internal pressure readings caused by the auxiliary transformer components so that the relay 150 does not take the transformer 110 offline. In another embodiment, the control system 160 of the rapid pressure rise detection and management system 100 compensates for the auxiliary transformer components 130 that cause internal pressure readings by temporarily turning off the pressure monitoring by the system 100 so that the relay 150 does not take the transformer 110 offline.

Referring now to FIG. 2, in some embodiments, the rapid pressure rise detection and management system 100 includes, or is in communication with, one or more seismic sensors 140. As described herein, seismic sensors 140 measure physical movement of the oil-filled transformer 110. Signals from the seismic sensors 140 may be analyzed by the control system 160 and the processor 164. In at least one embodiment, seismic sensors 140 include, but are not limited to, accelerometers, vibration sensors, seismographs, and seismometers. In some embodiments of the rapid pressure rise detection and management system 100, the control system 160 compensates for the seismic activity identified by the seismic sensor 140 that causes pressure readings by identifying, isolating, and ignoring the pressure readings caused by the seismic activity so that the relay 150 does not take the transformer 110 offline. In another embodiment, the control system 160 compensates for the seismic activity identified by the seismic sensor 140 that causes pressure readings by temporarily turning off the pressure monitoring by the system 100 so that the relay 150 does not take the transformer 110 offline.

As shown in FIG. 2, the rapid pressure rise detection and management system 100 includes, or is in communication with, a relay 150 having one or more electrically controlled actuation contacts 152 to take the transformer offline. If the calculated rate of pressure rise exceeds the selected response curve, then the control system 160 and the processor 164 actuate the relay 150 to take the transformer 110 offline. In some embodiments, the control system 160 sends signals to digital-to-relay circuitry 156 in the rapid pressure rise detection and management system 100. The digital-to-relay circuitry 156 converts the digital signal from the control system 160 to a relay signal that is forwarded to the relay 150 of the rapid pressure rise detection and management system 100. In another embodiment, the relay 150 is a digital component so the control system 160 of the rapid pressure rise detection and management system 100 may send digital signals directly to the relay 150 without requiring the digital-to-relay circuitry 156.

In some embodiments, the rapid pressure rise detection and management system 100 also includes a control system 160 having an associated memory device 162 storing a set of instructions thereon, as well as one or more processors 164 associated therewith. The one or more processors 164 are devices that can be programmed to perform the rapid pressure rise detection and management operations described herein. In various embodiments, the processor 160 includes, but is not limited to, microprocessors, microcontrollers, microcomputers, processor chipsets, and computer modules.

In some embodiments, the control system 160 of the rapid pressure rise detection and management system 100 receives signals from gas-space pressure sensors 122 and/or oil-space pressure sensors 126 of the oil-filled transformer 110. These signals are then converted and analyzed by the processor 164 of the rapid pressure rise detection and management system 100. The processor 164 calculates the rate of pressure rise in the oil-filled transformer 110 from these received signals. The control system 160 is programmable with multiple pressure rise response curves. In one embodiment, the control system includes programming for approximately twelve pressure rise response curves. In at least one embodiment, the rapid pressure rise detection and management system 100 selects one of these response curves, from among the multiple pressure rise response curves, in response to receiving user input, to compare against the calculated rate of pressure rise in the oil-filled transformer 110. If the calculated rate of pressure rise exceeds the selected response curve then the control system 160 actuates a relay 150 (or switch) to take the transformer 110 offline. For example, a rate of pressure rise would exceed a selected response curve by registering a data point that is higher in magnitude that the corresponding point on the response curve.

In some embodiments of the rapid pressure rise detection and management system 100, the control system 160 is programmed to select the proper response curve for the oil-filled transformer 110 being monitored by the system in response to receiving user input. In some embodiments, the control system 160 automatically changes which response curve in the plurality of response curves is being used until the appropriate level of sensitivity is reached. An appropriate level of sensitivity may be defined as a sensitivity level at which the system properly actuates the relay in response to internal arching-induced rapid pressure rises, but does not actuate the relay in response to "false positives," such as pressure rises due to the actions of auxiliary transformer components 130.

Notably, the control system 160 is configured to learn new rapid pressure rise curves in response to transformer operating characteristics. In one embodiment, the control system 160 learns a new rapid pressure rise curve by entering a "test mode" for a period of time during which there are no actual internal arching-induced rapid pressure rises. Accordingly, any rapid pressure rises that occur during this "test mode" period of time must be "false positives," such as pressure rises due to auxiliary transformer components 130 or seismic activity. Thus, the new rapid pressure rise curve that is learned is high enough that none of the pressure calculations during the "test mode" period of time will actuate the relay 150. The actual rate of pressure rise in an oil-filled transformer 110 is dependent on many different factors (e.g., transformer design, electrical impedances, transformer location, and the like). For this reason, the control system 160 was developed with the ability to learn and generate a response curve that is optimal for every unique transformer implementation, as described above using the "test mode."

The control system 160 also receives status inputs (e.g., on, off, idle, and the like) from the auxiliary transformer components 130 (e.g., pumps, fans, relays, and the like) along with any seismic movement of the transformer 110 as measured by the seismic sensor 140. The receipt of these status inputs enables the control system 160 to ignore the rate of pressure rise for the time period that certain equipment is active or for the time period that a seismic event is occurring.

In some embodiments of the rapid pressure rise detection and management system 100, the control system 160 compensates for (1) internal pressure readings caused by the auxiliary transformer components 130 and/or (2) seismic movement of the transformer 110 as measured by the seismic sensor 140, by identifying, isolating, and ignoring the internal pressure readings caused by the non-internal arcing events so that the relay 150 does not take the transformer 110 offline. In another embodiment, the control system 160 of the rapid pressure rise detection and management system 100 compensates for (1) internal pressure readings caused by the auxiliary transformer components 130 and/or (2) seismic movement of the transformer 110 as measured by the seismic sensor 140, by temporarily turning off the pressure monitoring by the system 100 so that the relay 150 does not take the transformer 110 offline.

Figure 6:
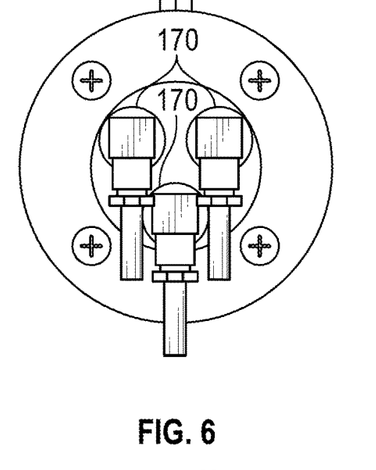
FIG. 6 is a front elevation view of a multiple sensor pressure monitor that is a component of the rapid pressure rise detection and management system.
Figure 7:
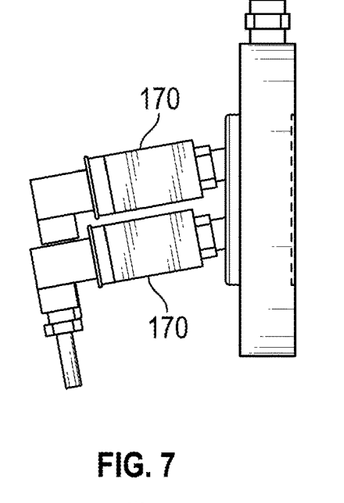
FIG. 7 is a side elevation view of a multiple sensor pressure monitor that is a component of the rapid pressure rise detection and management system.
Figure 8:
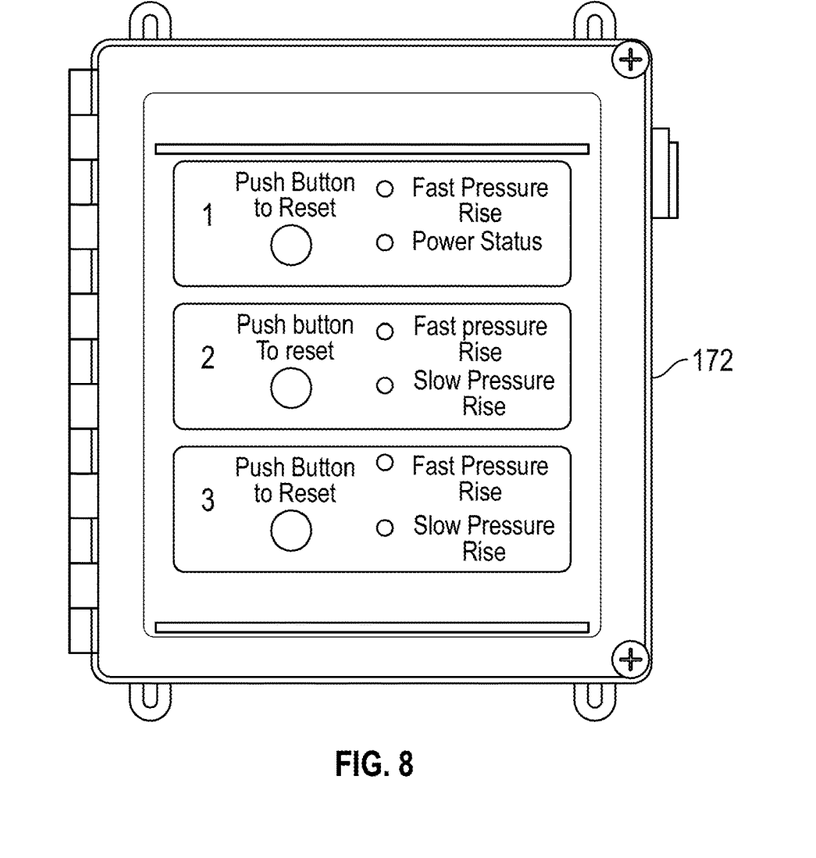
FIG. 8 is a front elevation view of a pressure monitor control box for a multiple sensor embodiment of the rapid pressure rise detection and management system.

Referring now to FIGS. 6-8, in some embodiments, the rapid pressure rise detection and management system 100 employs multiple pressure sensors 170 in a multiple sensor pressure monitor. FIG. 6 displays a front elevation view of a multiple sensor pressure monitor that is a component of the rapid pressure rise detection and management system 100. FIG. 7 displays a side elevation view of a multiple sensor pressure monitor that is a component of the rapid pressure rise detection and management system 100. FIG. 8 displays a front elevation view of a pressure monitor control box 172 for a multiple sensor embodiment of the rapid pressure rise detection and management system 100. In the embodiments shown in FIGS. 6-8, three pressure sensors 170 are being used in this implementation. In at least one such multiple pressure sensor embodiment, the control system 160 of the rapid pressure rise detection and management system 100 is programmed to actuate the relay 150 only if a majority of the sensors 170 in the multiple sensor pressure monitor transmit a calculated rate of pressure rise in the transformer 110 that exceeds the response curve limitations. In another embodiment, the multiple pressure sensors comprise three pressure sensors that are positioned orthogonally to each other within the transformer.

By using advancements both in technology and ingenuity, the rapid pressure rise detection and management system 100 described herein eliminates extraneous faults that would trigger earlier rapid pressure rise relay designs. This rapid pressure rise detection and management system 100 employs digital technology with one or more processors 164. As such, the system is not limited to a fixed set of curves, but rather is configurable with respect to the rate of rise curves, both in amplitude and time duration of the pressure rise. Additionally, since the actual rate of pressure rise in an oil-filled transformer 110 is dependent on many different factors (e.g., transformer design, electrical impedances, transformer location, and the like), the rapid pressure rise detection and management system 100 is able to learn and adjust a response curve that is optimal for every implementation. Moreover, the rapid pressure rise detection and management system 100 is programmable to ignore internal operations that might be construed as an internal fault (e.g., cooling pumps engaging and causing a momentary pressure increase). Lastly, the rapid pressure rise detection and management system 100 includes an accelerometer that may be calibrated to desensitize responses resulting from seismic activities, regardless of whether they are natural or manmade.

In one embodiment, the rapid pressure rise detection and management system 100 provides the technological improvement of incorporating programmable response curve parameters and the ability to select a curve from multiple response curves stored in the memory device 162 of the control system 160. In another embodiment, the rapid pressure rise detection and management system 100 provides the technological improvement of automatically adjusting the response curve sensitivity by learning the characteristics of a particular non-faulting oil cooled transformer and then using these characteristics to more accurately detect future internal faults. In still another embodiment, the rapid pressure rise detection and management system 100 provides the technological improvement of reading a plurality of oil-filled transformer pressure sensors 120 and uses programmable voting logic to prevent false activation of the relay 150. For example, such voting logic may determine whether a majority of the plurality of transformer pressure sensors 120 detect an internal fault that meets the threshold to trip the transformer 110 offline, thus preventing a single sensor error from tripping the transformer offline.

In yet another embodiment, the rapid pressure rise detection and management system 100 provides the technological improvement of being able to detect seismic events (both natural and manmade) and prevent false activation of the relay 150 by either programming the system to ignore these seismic events or suspending operation of the system during these seismic events. Continuing, in still another embodiment, the rapid pressure rise detection and management system 100 provides the technological improvement of being able to perform either as a standalone device or to work with other monitoring equipment as part of a larger monitoring and control system. In another embodiment, the rapid pressure rise detection and management system 100 provides the technological improvement of preventing false activation during specific transformer operations (e.g., starting cooling pumps) by either programming the system to ignore these specific transformer operations or suspending operation of the system 100 during these specific transformer operations.

In the rapid pressure rise detection and management system 100, various aspects of the systems, methods, functions, steps, features and the like corresponding thereto disclosed herein may be implemented on one or more computer systems using hardware, software, firmware, circuits, or combinations thereof. Hardware, software, firmware, and circuits respectively refer to any hardware, software, firmware, or circuit component. Computer systems referred to herein may refer to any computing device and vice versa (e.g., smart phone, mobile computing device, personal data assistant, tablet computer, laptop computer, desktop computer, other computing device, and the like).

As disclosed herein, in some embodiments of the rapid pressure rise detection and management system 100, a processor 164 may refer to any hardware processor or software processor. A software processor may include or otherwise constitute an interpreter that is executed by a corresponding hardware processor. A computer system according to any embodiment disclosed herein is configured to perform any of the described functions related to the various embodiments of the systems disclosed herein.

In at least one embodiment of the rapid pressure rise detection and management system 100, any method, function, step, feature, or result may be considered a module that may include software instructions that cause, when executed by a computing device, the desired method, function, step, feature, or result. Executed by a computing device includes execution by any hardware component (e.g., CPU, GPU, network interface, integrated circuits, other hardware components, and the like) of the computing device such as a hardware processor 164. Any module may be executed by a computing device (e.g., by a processor of the computing device). Any method, function, step, feature, result, and the like disclosed herein may be implemented by one or more software modules whether explicitly described or not. Individual components within a computing device may work together to accomplish a desired method, function, step, feature, or result. For example, a computing device may receive data and process the data. A simple example would be that a network interface receives the data and transmits the data over a bus to a processor 164.

Various aspects of the rapid pressure rise detection and management system 100 disclosed herein may be implemented as software executing in a computer system. The computer system may include a central processing unit (i.e., a hardware processor) connected to one or more memory devices 162, a graphical processing unit, input devices such as a mouse and keyboard, output devices such as speakers and a display, a network interface to connect to one or more other computer systems (e.g., one or more computer systems configured to provide a service such that function as a database), an operating system, a compiler, an interpreter (i.e., a virtual machine), and the like.

In some embodiments of the rapid pressure rise detection and management system 100, the memory device 162 may be any type of memory such as read-only memory (ROM), static random access memory (RAM) or dynamic RAM, among others. The memory device 162 is configured to store executable instructions that, when executed by the processor 164, cause the processor to perform the operations/techniques described herein. The memory device 162 may be used to store executable programs and data during operation of the computer system. The executable programs may be written in a high-level computer programming language, such as Java or C++. Of course, other programming languages may be used since this disclosure is not limited to a specific programming language or computer system. Further, it is to be appreciated that the systems and methods disclosed herein are not limited to being executed on any particular computer system or group of computer systems.

Throughout the specification, claims, and drawings of the rapid pressure rise detection and management system 100, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

Some portions of the detailed description of the rapid pressure rise detection and management system 100 are presented in terms of algorithms and symbolic representations of operations on data bits within a computer memory. These algorithmic descriptions and representations are the means used by those skilled in the data processing arts to most effectively convey the substance of their work to others skilled in the art. An algorithm, as described herein, is a sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," "configuring," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the rapid pressure rise detection and management system 100 also relate to an apparatus for performing the operations herein. This apparatus may be specially constructed for the required purposes, and it may require selective activation or reconfiguration by a computer program stored in the computer. Such a computer program may be stored in a computer readable storage medium, such as, but not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

Moreover, in the of the rapid pressure rise detection and management system 100, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The foregoing description, for purposes of explanation, uses specific nomenclature and formula to provide a thorough understanding of the disclosed embodiments. It should be apparent to those of skill in the art that the specific details are not required in order to practice the invention. The embodiments have been chosen and described to best explain the principles of the disclosed embodiments and its practical application, thereby enabling others of skill in the art to utilize the disclosed embodiments, and various embodiments with various modifications as are suited to the particular use contemplated. Thus, the foregoing disclosure is not intended to be exhaustive or to limit the invention to the precise forms disclosed, and those of skill in the art recognize that many modifications and variations are possible in view of the above teachings.

The various embodiments described above can be combined to provide further embodiments. All of the U.S. patents, referred to in this specification are incorporated herein by reference, in their entirety. Aspects of the embodiments can be modified, if necessary to employ concepts of the various patents to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the breadth and scope of a disclosed embodiment should not be limited by any of the above-described exemplary embodiments, but should be defined only in accordance with the following claims and their equivalents.

What is claimed is:

1. A rapid pressure rise relay system for detecting a pressure rise within a transformer, the system comprising:
   one or more pressure sensors associated with the transformer, the one or more pressure sensors generating electrical outputs in response to pressure changes within the transformer;
   a seismic sensor that measures seismic activity and generates an electrical output in response to the seismic activity;
   a relay that includes one or more electrically controlled actuation contacts to take the transformer offline;
   one or more processors in communication with the one or more pressure sensors, one or more auxiliary transformer components associated with the transformer, the seismic sensor, and the relay, wherein the one or more auxiliary transformer components each generate an electrical output that identifies a status;
   a control system having a memory device storing a set of instructions that, when executed by the one or more processors, causes the one or more processors to:
   examine the electrical outputs generated by the one or more pressure sensors;
   calculate the pressure rise within the transformer over time using the electrical outputs generated by the one or more pressure sensors;
   compare the calculated pressure rise within the transformer over time to one or more rapid pressure rise curves;
   identify the status of the auxiliary transformer components that cause internal pressure readings and compensate for the internal pressure readings from the auxiliary transformer components to prevent unnecessary relay actuation;
   identify seismic activity using the seismic sensor and prevent unnecessary relay actuation from the seismic activity; and
   actuate the relay and take the transformer offline if the calculated pressure rise within the transformer over time exceeds allowable limits set by the one or more rapid pressure rise curves.

2. The system of claim 1, wherein the auxiliary transformer components associated with the transformer that each generate an electrical output identifying a status include pumps, fans, motors, coolers, breathers, dryers, and tap changers.

3. The system of claim 1, wherein the seismic sensor that measures seismic activity and generates an electrical output in response to the seismic activity is an accelerometer.

4. The system of claim 1, wherein the control system compensates for the auxiliary transformer components that cause internal pressure readings by identifying, isolating, and ignoring the internal pressure readings caused by the auxiliary transformer components.

5. The system of claim 1, wherein the control system compensates for the auxiliary transformer components that cause internal pressure readings by temporarily having the control system halt calculations of the pressure rise within the transformer.

6. The system of claim 1, wherein the control system compensates for the pressure readings caused by the seismic activity identified with the seismic sensor by identifying, isolating, and ignoring the pressure readings caused by the seismic activity.

7. The system of claim 1, wherein the control system compensates for the pressure readings caused by the seismic activity identified with the seismic sensor by temporarily having the control system halt calculations of the pressure rise within the transformer.

8. The system of claim 1, wherein the control system is configured to learn new rapid pressure rise curves in response to transformer operating characteristics.

9. The system of claim 1, wherein the control system is programmable for rate of rapid pressure rise curve parameters, wherein the control system includes multiple rates of rapid pressure rise curves, and wherein the control system enables automatic shifting between the rapid pressure rise curves according to transformer operating characteristics.

10. The system of claim 1, further comprising multiple pressure sensors to detect pressure changes within the transformer, wherein the control system compares rates of pressure changes detected by the multiple pressure sensors within the transformer to the rapid pressure rise curves and uses voting logic to determine whether to actuate the relay.

11. The system of claim 10, wherein the multiple pressure sensors comprise three pressure sensors that are positioned orthogonally to each other within the transformer.

12. A rapid pressure rise relay system for detecting a pressure rise within a transformer, wherein the transformer contains one or more pressure sensors generating electrical outputs in response to pressure changes within the transformer, the system comprising:
 one or more processors in communication with the one or more pressure sensors, auxiliary transformer components, a seismic sensor, and a relay;
 a control system having a memory device storing a set of instructions that, when executed by the one or more processors, causes the one or more processors to:
  examine the electrical outputs generated by the one or more pressure sensors;
  calculate the pressure rise within the transformer over time using the electrical outputs generated by the one or more pressure sensors;
  compare the calculated pressure rise within the transformer over time to one or more rapid pressure rise curves;
  identify a status of the auxiliary transformer components that cause internal pressure readings and compensate for the internal pressure readings from the auxiliary transformer components to prevent unnecessary relay actuation;
  identify pressure readings caused by seismic activity using the seismic sensor and compensate for the pressure readings caused by the seismic activity to prevent unnecessary relay actuation; and
  actuate the relay and take the transformer offline if the calculated pressure rise within the transformer over time exceeds allowable limits set by the one or more rapid pressure rise curves.

13. The system of claim 12, wherein the auxiliary transformer components associated with the transformer that each generate an electrical output identifying a status include pumps, fans, motors, coolers, breathers, dryers, and tap changers.

14. The system of claim 12, wherein the seismic sensor that measures seismic activity and generates an electrical output in response to the seismic activity is an accelerometer.

15. The system of claim 12, wherein the control system compensates for the auxiliary transformer components that cause internal pressure readings by identifying, isolating, and ignoring the internal pressure readings caused by the auxiliary transformer components.

16. The system of claim 12, wherein the control system compensates for the auxiliary transformer components that cause internal pressure readings by temporarily having the control system halt calculations of the pressure rise within the transformer.

17. The system of claim 12, wherein the control system compensates for the pressure readings caused by the seismic activity identified with the seismic sensor by identifying, isolating, and ignoring the pressure readings caused by the seismic activity.

18. The system of claim 12, wherein the control system compensates for the pressure readings caused by the seismic activity identified with the seismic sensor by temporarily having the control system halt calculations of the pressure rise within the transformer.

19. The system of claim 12, wherein the control system is configured to learn new rapid pressure rise curves in response to transformer operating characteristics.

20. The system of claim 12, wherein the control system is programmable for rate of rapid pressure rise curve parameters, wherein the control system includes multiple rates of rapid pressure rise curves, and wherein the control system enables automatic shifting between the rapid pressure rise curves according to transformer operating characteristics.

21. The system of claim 12, further comprising multiple pressure sensors to detect pressure changes within the transformer, wherein the control system compares rates of pressure changes detected by the multiple pressure sensors within the transformer to the rapid pressure rise curves and uses voting logic to determine whether to actuate the relay.

22. The system of claim 21, wherein the multiple pressure sensors comprise three pressure sensors that are positioned orthogonally to each other within the transformer.

23. A rapid pressure rise relay system for detecting a pressure rise within a transformer, wherein the transformer contains one or more pressure sensors generating electrical outputs in response to pressure changes within the transformer, the system comprising:
 one or more processors in communication with the one or more pressure sensors, auxiliary transformer components, a seismic sensor, and a relay;

a control system having a memory device storing a set of instructions that when executed by the one or more processors, causes the one or more processors to:
examine the electrical outputs generated by the one or more pressure sensors;
calculate the pressure rise within the transformer over time using the electrical outputs generated by the one or more pressure sensors;
compare the calculated pressure rise within the transformer over time to one or more rapid pressure rise curves;
identify pressure readings caused by non-internal arcing events and compensate for the pressure readings caused by the non-internal arcing events to prevent unnecessary relay actuation; and
actuate the relay and take the transformer offline if the calculated pressure rise within the transformer over time exceeds allowable limits set by the one or more rapid pressure rise curves.

24. The system of claim 23, wherein the non-internal arcing events include internal pressure surges caused by auxiliary transformer components associated with the transformer and pressure surges caused by seismic activity.

25. The system of claim 24, wherein the auxiliary transformer components associated with the transformer include pumps, fans, motors, coolers, breathers, dryers, and tap changers.

26. The system of claim 24, wherein the seismic activity is measured by a seismic sensor that comprises an accelerometer.

27. The system of claim 24, wherein the control system compensates for the auxiliary transformer components that cause internal pressure readings by identifying, isolating, and ignoring the internal pressure readings caused by the auxiliary transformer components.

28. The system of claim 24, wherein the control system compensates for the auxiliary transformer components that cause internal pressure readings by temporarily having the control system halt calculations of the pressure rise within the transformer.

29. The system of claim 26, wherein the control system compensates for the pressure readings caused by the seismic activity identified with the seismic sensor by identifying, isolating, and ignoring the pressure readings caused by the seismic activity.

30. The system of claim 26, wherein the control system compensates for the pressure readings caused by the seismic activity identified with the seismic sensor by temporarily having the control system halt calculations of the pressure rise within the transformer.

31. The system of claim 23, wherein the control system is configured to learn new rapid pressure rise curves in response to transformer operating characteristics.

32. The system of claim 23, wherein the control system is programmable for rate of rapid pressure rise curve parameters, wherein the control system includes multiple rates of rapid pressure rise curves, and wherein the control system enables automatic shifting between the rapid pressure rise curves according to transformer operating characteristics.

33. The system of claim 23, further comprising multiple pressure sensors to detect pressure changes within the transformer, wherein the control system compares rates of pressure changes detected by the multiple pressure sensors within the transformer to the rapid pressure rise curves and uses voting logic to determine whether to actuate the relay.

34. The system of claim 33, wherein the multiple pressure sensors comprise three pressure sensors that are positioned orthogonally to each other within the transformer.

* * * * *